(12) United States Patent
Lintymer et al.

(10) Patent No.: US 11,857,035 B2
(45) Date of Patent: Jan. 2, 2024

(54) METHOD FOR MANUFACTURING A PART COMPRISING AT LEAST ONE THREE-DIMENSIONAL METALLISED PATTERN

(71) Applicant: Comadur SA, Le Locle (CH)

(72) Inventors: Jan Lintymer, Mamirolle (FR);
Damien Le Boudouil, Morteau (FR);
Benoit Baichette, Neuchatel (CH)

(73) Assignee: Comadur SA, Le Locle (CH)

(*) Notice: Subject to any disclaimer, the term of this patent is extended or adjusted under 35 U.S.C. 154(b) by 345 days.

(21) Appl. No.: 17/372,685

(22) Filed: Jul. 12, 2021

(65) Prior Publication Data
US 2022/0039526 A1 Feb. 10, 2022

(30) Foreign Application Priority Data
Aug. 4, 2020 (EP) .................................. 20189291

(51) Int. Cl.
| A44C 27/00 | (2006.01) |
| G03F 7/20 | (2006.01) |
| G03F 7/038 | (2006.01) |
| G03F 7/039 | (2006.01) |

(52) U.S. Cl.
CPC .......... *A44C 27/006* (2013.01); *G03F 7/2002* (2013.01); *G03F 7/2006* (2013.01); *G03F 7/038* (2013.01); *G03F 7/039* (2013.01)

(58) Field of Classification Search
CPC .................................................. G04B 45/0076
See application file for complete search history.

(56) References Cited

U.S. PATENT DOCUMENTS

| 2016/0176126 A1* | 6/2016 | Kissling ................. B29B 11/14 |
| | | 428/156 |
| 2016/0176228 A1 | 6/2016 | Dubach et al. |
| 2017/0334236 A1* | 11/2017 | Grossenbacher .... G04D 3/0048 |
| 2019/0278182 A1* | 9/2019 | Laforge ............. G04B 45/0069 |

FOREIGN PATENT DOCUMENTS

| EP | 0 453 382 A1 | 10/1991 |
| EP | 0453382 A1 * | 10/1991 |
| EP | 0 453 382 B1 | 9/1994 |
| EP | 3 035 129 A1 | 6/2016 |
| EP | 3 246 766 A1 | 11/2017 |
| EP | 3 035 129 B1 | 11/2020 |
| JP | 2016-128799 A | 7/2016 |
| WO | WO 2018/114205 A1 | 6/2018 |
| WO | WO-2018114205 A1 * | 6/2018 |

OTHER PUBLICATIONS

English Machine Translation of WO2018114205A1 (Year: 2018).*
English Machine Translation of EP0453382A1 (Year: 1991).*
Notice of Grounds for Rejection dated Aug. 26, 2022 in Korean Patent Application No. 10-2021-0099463 (with English language translation), citing documents 1 and 15 therein, 13 pages.
European Search Report dated Feb. 12, 2021 in European Application 20189291.6 filed Aug. 4, 2020 (with English Translation of Categories of Cited Documents), 3 pages.

* cited by examiner

*Primary Examiner* — Mark F. Huff
*Assistant Examiner* — Nicholas E Brown
(74) *Attorney, Agent, or Firm* — Oblon, McClelland, Maier & Neustadt, L.L.P.

(57) ABSTRACT

The present invention relates to a method for manufacturing a part comprising at least one three-dimensional metallised pattern overlying a local enamel underlayer.

18 Claims, 2 Drawing Sheets

METHOD FOR MANUFACTURING A PART COMPRISING AT LEAST ONE THREE-DIMENSIONAL METALLISED PATTERN

CROSS-REFERENCE TO RELATED APPLICATIONS

This application is based upon and claims the benefit of priority from European Patent Application 20189291.6, filed on Aug. 4, 2020, the entire contents of all of which are incorporated herein by reference.

TECHNICAL FIELD

The invention relates to a method for manufacturing a part comprising at least one three-dimensional metallised pattern overlying a local enamel underlayer.

The invention also relates to a part manufactured by such a manufacturing method. Such a part can in particular be a decorated component of a timepiece external part or a piece of jewellery.

TECHNOLOGICAL BACKGROUND

It is known to produce decorated components for timepiece external parts or for pieces of jewellery. For example, such decorated components can consist of the inlaying of aesthetic patterns on a portion of a watch. It may be a watch bezel decorated with patterns such as indices; or else a watch dial decorated with an index; or else a crown, a crystal or the middle of the watch, decorated with one or more patterns, or else bracelet links. The portion of the watch concerned with the decoration can be marked, for example by means of a metal such as gold, silver or platinum, with a raised or deep marking. If this is a deep marking, the latter is for example made by filling hollows previously formed in a substrate or base support of the watch portion.

The principle used for performing such a deep marking consists in first depositing a conductive layer by physical vapour deposition PVD. Once the conductive layer is deposited, the hollows are filled with a metal by electroforming by immersing the part in a bath of metal ions, then an electric current is circulated in this bath. Thus the hollows are filled with metal to carry out the marking. In this regard, mention may be made of patent document EP 2 138 323 A1 which describes such a method. However, such a method is complex and relatively slow to implement in order to produce the decorative component on the timepiece external part, because it requires several production steps, which is a drawback. In addition, another drawback of such a method is that it operates by depositing thin layers only, which does not allow satisfactory three-dimensional decorative patterns to be produced on the timepiece external part.

Moreover, methods for producing decorated components for timepieces, implementing galvanic growth or electroplating are known. Such a method is for example described in patent document EP 3 035 128 A1. The manufacturing method described in this document comprises the steps consisting in providing a silicon base substrate and in carrying out micromachining in this base substrate so as to obtain an upper portion provided with a decoration passing through the thickness of this portion. This micromachining step comprises the phases consisting in depositing on an upper conductive layer of the base substrate a layer of photosensitive resin; then in placing on the photosensitive resin a mask around the outline of the upper portion and of the pattern of the decoration to be produced; then in exposing the resin to radiation through the mask, so as to develop some portions of the resin; then in removing the undeveloped resin portions and in filling the portions of the resin thus opened with a metallic material; in carrying out an electroplating or electrodeposition operation implementing growth of the metallic material; and finally in removing all the resin and detaching the upper portion with the pattern of the decoration produced from the base substrate. However, a drawback of such a method is that it does not allow easy production of precise and mastered three-dimensional shapes for the decorations. Thus, such a method does not allow to produce three-dimensional decorative patterns in a clean and controlled manner on the timepiece external part.

SUMMARY OF THE INVENTION

The purpose of the invention is therefore to provide a method for manufacturing a part that makes it easy to produce three-dimensional metallised decorative patterns on the part, and to obtain patterns that can have complex, precise and controlled shapes.

To this end, the invention relates to a method for manufacturing a part comprising at least one three-dimensional metallised pattern overlying a local enamel underlayer, which comprises the features mentioned in independent claim 1.

Particular forms of the manufacturing method are defined in dependent claims 2 to 17.

The manufacturing method according to the invention allows, thanks to the prior three-dimensional formation on the substrate of one or more enamel pattern(s) then to the deposition of a structured metal layer on these patterns, to be able to easily produce three-dimensional metallic decorative patterns on the part. The three-dimensional decorative patterns thus produced are clean, and can advantageously have complex, precise and controlled shapes. Furthermore, the use of metallised enamel has the additional advantages of being inert to chemical products and resistant to high temperatures, unlike some materials used in the solutions of the prior art.

According to a preferred embodiment of the invention, the photosensitive resin is a negative photosensitive resin, the portions of the resin layer complementary to the three-dimensional pattern(s) are the undeveloped portions of the resin layer, and the remaining resin portions are the developed portions of the resin layer.

Advantageously, the enamel of the local enamel underlayer has been sintered beforehand. This makes the enamel porous and thus facilitates the three-dimensional shaping of the enamel pattern(s).

To this end, the invention also relates to a part manufactured using the manufacturing method as described above, and which comprises the features mentioned in claim 15.

BRIEF DESCRIPTION OF THE FIGURES

The purposes, advantages and features of the method for manufacturing a part comprising at least one three-dimensional metallised pattern according to the invention will appear better in the following description on the basis of at least one non-limiting embodiment illustrated by the drawings on which.

DETAILED DESCRIPTION OF THE INVENTION

Figure 1:
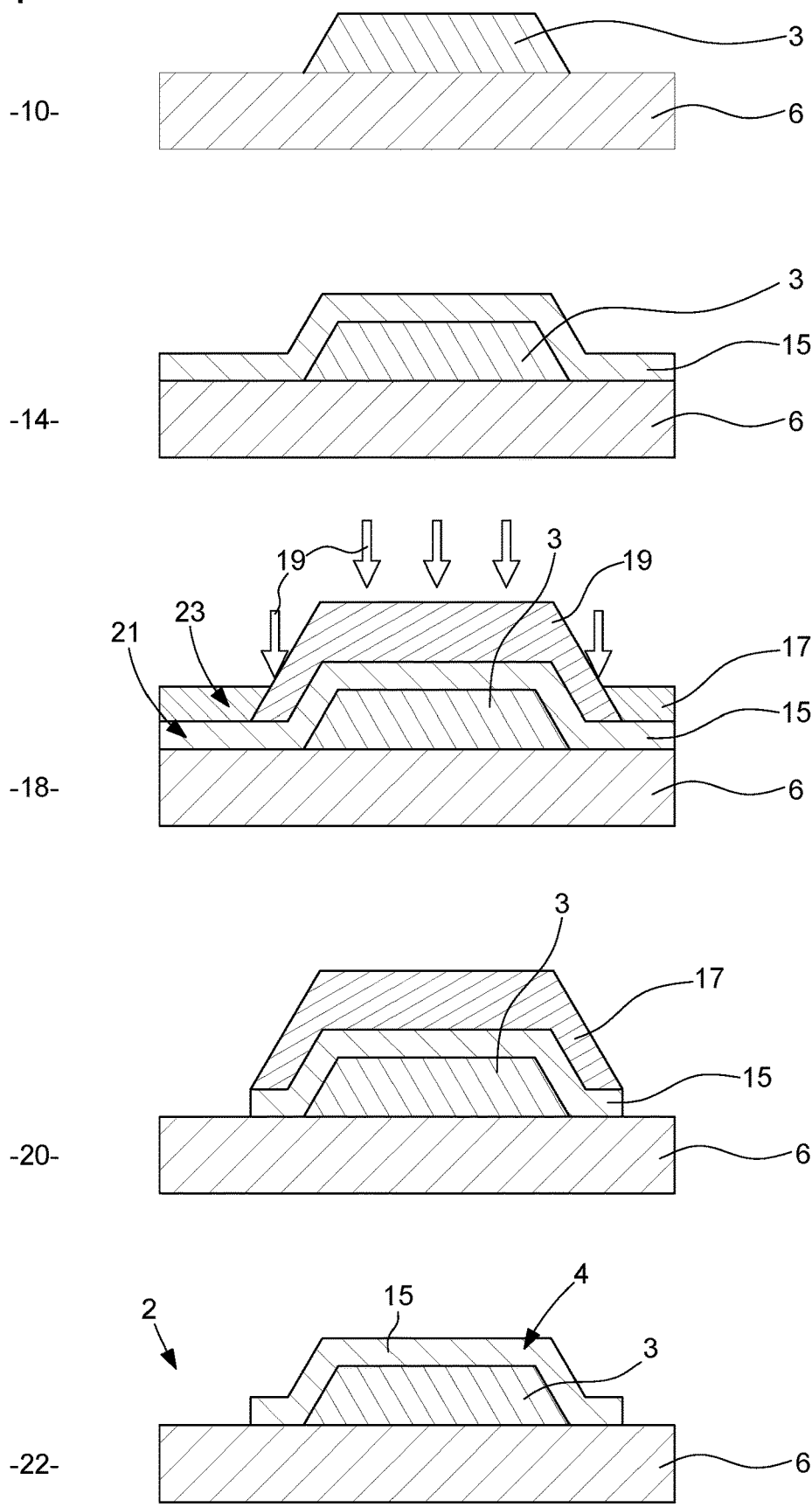
FIG. 1 is a flowchart showing a succession of steps of a method for manufacturing a part comprising at least one three-dimensional metallised pattern according to the invention, the metallised pattern overlying a local enamel underlayer.

The method for manufacturing a part 2 comprising at least one three-dimensional metallised pattern 4 according to the invention will be described with reference to FIG. 1. The part 2 is typically a decorated component of a timepiece external part or a piece of jewellery, such as for example a watch bezel, or a watch dial decorated with a three-dimensional index, or else a crown, a crystal or a middle of the watch. Without this being limiting in the context of the present invention, the three-dimensional metallised patterns 4 are, for example, indices, indexes, logos, or else aesthetic decorations.

During an initial step 10, provision is made of a substrate 6 on which are formed, beforehand, in three dimensions, one or more enamel pattern(s) 3. Preferably, the enamel constituting the patterns 3 is sintered beforehand.

This local enamel underlayer can be manufactured according to any type of known manufacturing method. In particular, and without this being limiting in the context of the present invention, an example of such a method will now be described with reference to FIG. 2.

During a first step 40, the bare substrate 6 is provided. The substrate 6 consists of a material capable of withstanding high temperatures, in particular temperatures that can reach up to 1400° C. The substrate 6 is preferably selected from the group consisting of zircon, alumina, sapphire or ruby. However, it can also be a semiconductor substrate 6, such as silicon, or else gallium arsenide, an upper layer of which may be conductive, or a substrate made of natural material such as mother-of-pearl.

During a next step 42, a layer of photosensitive resin 8 is deposited on the upper surface of the substrate 6.

During a following step 44, the photosensitive resin layer 8 is selectively exposed to radiation 5, so as to locally develop portions 11 of resin 8 with the purpose of forming empty portions 9 in the resin 8. The radiation 5 used is, for example, ultra-violet (UV) radiation emitted by a laser or a UV lamp. To perform this structuring of the resin 8, a mask (not shown) is applied to the resin layer 8, the outline of the mask corresponding to the empty portions 9 to be formed. The photosensitive resin 8 is for example a negative photosensitive resin. This resin 8 can be a photopolymerisable resin, for example a resin based on polyimide PMMA (poly-methyl methacrylate) or an octofunctional epoxy resin available from Shell Chemical under the reference SU-8 and a photo-initiator selected for example from triarylsulfonium salts. The mask may be a quartz plate on which is produced a masking layer with opaque and transparent portions according to the empty portions 9 to be produced. Alternatively, the photosensitive resin 8 can be a positive photosensitive resin. In this case, the mask is the reverse of the mask used with the negative photosensitive resin. At the end of this step 44 the mask is removed.

During a next step 46, the portions of the resin layer 8 corresponding to the empty portions 9 to be formed are removed. This removal step is for example carried out by physical or chemical means. In the case where a negative photosensitive resin is used (as is the case in FIG. 2), it is the non-irradiated portions 13 of the resin 8 which are removed. The portions 13 thus removed in the resin 8 then allow to reveal the empty portions 9 in the resin 8. Conversely, in the case where a positive photosensitive resin is used (case not shown in the figures), these are the irradiated portions of the resin that are removed. A non-photosensitive resin can also be used, in which case the latter is removed mechanically via laser ablation.

During a next step, the empty portions 9 in the resin 8 are filled with an enamel powder 25.

During a next step 50, the enamel powder 25 is pre-baked. For this purpose, the enamel powder 25 is for example heated to a temperature of 200° C., for example for 50 minutes. During this same step 50, or during a following step, the remaining portions 11 of the resin 8 are removed, for example thermally. For this purpose, the remaining portions 11 of the resin 8 are, for example, heated to a temperature of 600° C., for example for 30 minutes. This removal of the last remaining portions 11 of resin 8 allows to reveal the enamel pattern(s) 3, at the areas corresponding to the empty portions 9 of the preceding resin.

Preferably, during a following step 52, the assembly formed of the substrate 6 and of the enamel pattern(s) 3 is cleaned.

Preferably, during a final step 54, the enamel of the pattern(s) 3 is sintered, which allows to facilitate the three-dimensional shaping of the enamel pattern(s) 3 and to facilitate the adhesion of the metal layer.

Figure 2:
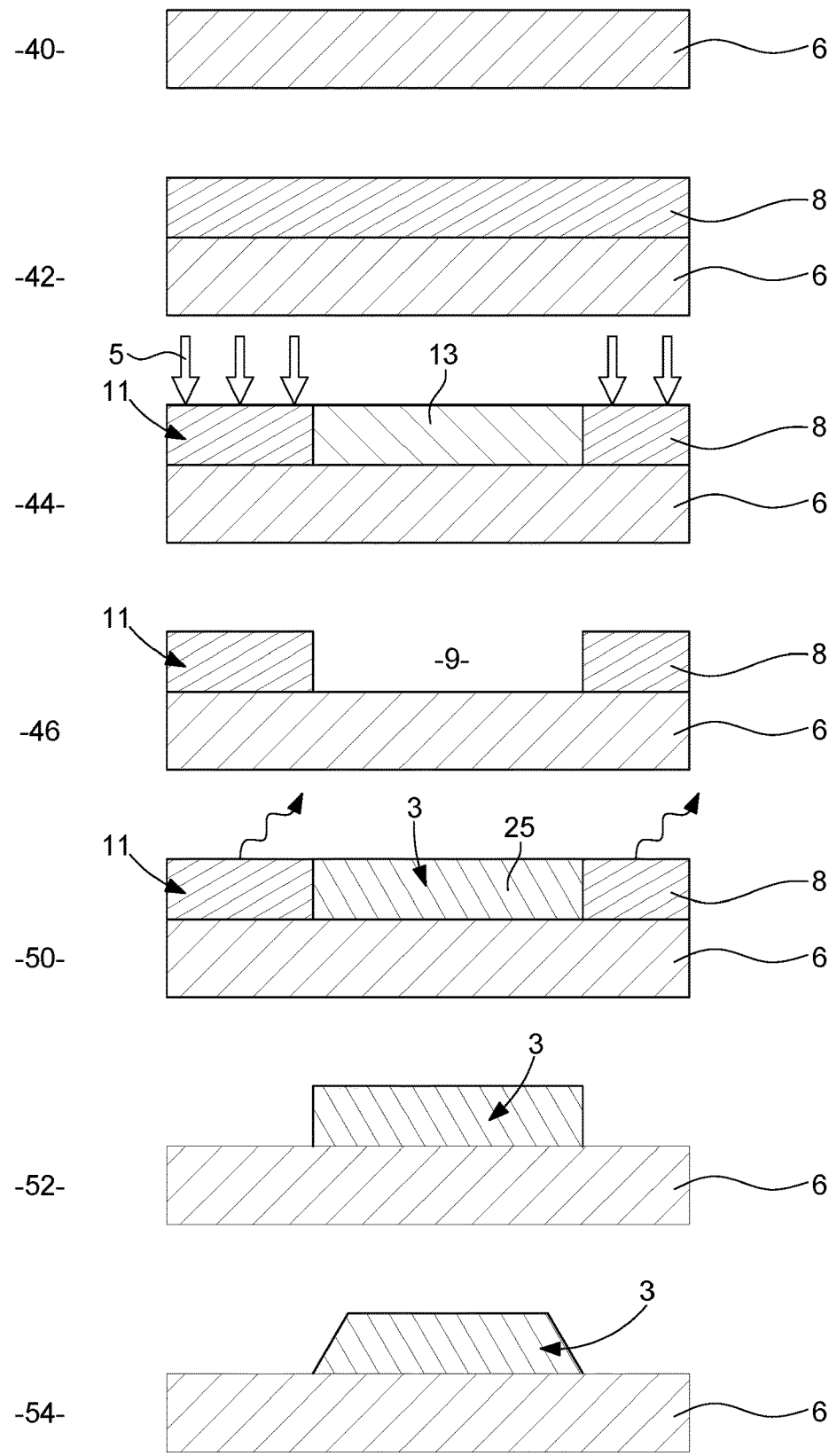
FIG. 2 is a flowchart representing a succession of steps of a method for manufacturing the local enamel underlayer of FIG. 1.

The example of a method for manufacturing the local enamel underlayer forming the patterns 3 shown in FIG. 2 has the advantage of not requiring complex tools, and of being relatively simple to implement and little expensive.

Another example of a method for manufacturing the local enamel underlayer forming the patterns 3, not shown in the figures, consists in applying the enamel directly to the substrate by pad printing, during one or more initial steps. The enamel is then pre-baked during a next step. For this purpose, the enamel is, for example, heated to a temperature of 177° C., for example for 60 minutes. Preferably, during a next step, the enamel of the pattern(s) is sintered. For this purpose, the enamel is for example sintered at a temperature of 860° C., for example for 5 minutes. This sintering step allows to define the desired shapes in the enamel and thus reveal the enamel pattern(s). Preferably, in a final step, the assembly formed of the substrate and the enamel pattern(s) is cleaned. This particular exemplary embodiment of the method for manufacturing the local enamel underlayer has the advantage of not requiring any structuring on a photosensitive resin.

Returning to the manufacturing method according to the invention, as illustrated in FIG. 1, the enamel pattern(s) 3 are cleaned during a following preferential step.

During a following step 14, at least one metallisation layer 15 is deposited on the enamel pattern(s) 3. Preferably, as illustrated in FIG. 1, the metallisation layer 15 completely covers the enamel pattern(s) 3 at the end of this deposition step 14. More preferably, the metallisation material used during this deposition step 14 is chromium nitride, zirconium oxynitride, or else gold. Obviously, the metallisation step can consist of a stack of several metal layers.

During a following step, a photosensitive resin layer 17 is deposited on the metallisation layer 15. Preferably, as illustrated in FIG. 1, the photosensitive resin layer 17 completely covers the metallisation layer 15 at the end of this deposition step.

During a next step 18, the photosensitive resin layer 17 is selectively exposed to radiation 7, so as to locally develop resin portions 19. These resin portions 19 correspond to the three-dimensional pattern(s). The radiation 7 used is, for example, ultra-violet (UV) radiation emitted by a lamp. To perform this structuring of the resin 17, a mask (not shown) is applied above the resin layer 17, the mask corresponding to the three-dimensional pattern(s). The photosensitive resin 17 is for example a negative photosensitive resin. This resin 17 can be a photopolymerisable resin, for example a resin based on polyimide PMMA (poly-methyl methacrylate) or an octofunctional epoxy resin available from Shell Chemical under the reference SU-8 and a photo-initiator selected for example from triarylsulfonium salts. The mask may be a quartz plate on which is produced a masking layer with opaque and transparent portions. Alternatively, the photosensitive resin 8 can be a positive photosensitive resin. In this case, the mask is the reverse of the mask used with the negative photosensitive resin. At the end of this step 18 the mask is removed.

According to another embodiment, a non-photosensitive resin is used, once the resin has dried, the latter is removed mechanically via laser ablation and therefore does not require a mask.

During a next step 20, the portions of the resin layer 17 complementary to the pattern(s) are removed. This removal step 20 is for example carried out by physical or chemical means. During this same step 20, the corresponding underlying portions 21 of the metallisation layer 15 are also removed. Preferably, the underlying portions 21 of the metallisation layer 15, which correspond to the portions of the resin layer 17 complementary to the pattern(s), are removed by chemical attack (also called etching). In the case where a negative photosensitive resin is used (as is the case in FIG. 1), it is the non-irradiated portions 23 of the resin 17 which form the portions complementary to the pattern(s) and which are removed during this step 20. The resin portions 19 developed locally (therefore irradiated) then correspond to the pattern(s). Conversely, in the case where a positive photosensitive resin is used (a case not shown in the figures), it is the irradiated portions of the resin which form the portions complementary to the pattern(s) and which are removed. The non-irradiated resin portions then correspond to the pattern(s).

During a next step 22, the remaining portions of the resin 17, corresponding to the pattern(s), are removed. This step 22 is for example carried out using a solvent. This allows to reveal the three-dimensional metallised pattern(s) 4. Each pattern 4 then consists of the metallisation material 15 deposited on a local enamel underlayer 3. In the case where a negative photosensitive resin is used (as is the case in FIG. 1), it is the developed portions 19 of the resin 17 which form the remaining portions and which are removed during this step 22. Conversely, in the case where a positive photosensitive resin is used (case not shown in the figures), it is the undeveloped portions of the resin which form the remaining portions and which are removed during this step 22.

Preferably, during a final step, the part 2 is cleaned.

It is thus understood that the manufacturing method according to the invention allows to easily produce three-dimensional metallised decorative patterns 4 on the part 2. The three-dimensional decorative patterns 4 thus produced are clean, and can advantageously have complex, precise and mastered shapes.

The invention claimed is:

1. A method for manufacturing a part comprising at least one three-dimensional metallised pattern overlying a local enamel underlayer; the method comprising the steps of:

providing a substrate on which are formed, beforehand, in three dimensions, at least one enamel pattern;

depositing at least one metallisation layer on the at least one enamel pattern;

depositing a resin layer on the at least one metallisation layer;

selectively working the resin layer, so as to locally form resin portions corresponding to or complementary to the at least one three-dimensional pattern;

removing the resin portions complementary to the at least one three-dimensional pattern, as well as underlying portions corresponding to the at least one metallisation layer; and removing remaining resin portions, so as to reveal the at least one corresponding three-dimensional metallised pattern, the or each pattern being made of a material of the metallisation layer deposited on the local enamel underlayer.

2. The method according to claim 1, wherein
the resin is a negative or positive photosensitive resin,
the portions of the resin layer complementary to the at least one three-dimensional pattern are undeveloped or developed portions of the resin layer, and
the remaining resin portions are the developed or undeveloped portions of the resin layer.

3. The method according to claim 1, wherein the enamel of the local enamel underlayer has been sintered beforehand.

4. The method according to claim 1, further comprising, before the step of depositing a metallisation layer, a step of cleaning the at least one enamel pattern.

5. The method according to claim 1, wherein the remaining resin portions are removed by means of a solvent.

6. The method according to claim 1, it further comprising a final step of cleaning the part.

7. The method according to claim 1, wherein the metallisation material is chromium nitride, zirconium oxynitride, gold or titanium.

8. The method according to claim 1, wherein the resin is a photopolymerisable resin.

9. The method according to claim 8, wherein the photopolymerisable resin is one of a photopolymerisable epoxy resin and an octofunctional epoxy resin SU-8.

10. The method according to claim 1, wherein the resin is a non-photosensitive epoxy-based resin.

11. The method according to claim 1, wherein the step of selectively working the resin layer is carried out by means of a UV lamp, and comprises an initial phase of applying a mask on a photosensitive resin layer, an outline of the mask corresponding to said at least one three-dimensional pattern.

12. The method according to claim 1, wherein the step of selectively working the resin layer is carried out by means of laser ablation.

13. The method according to claim 1, wherein the portions of the metallisation layer underlying the portions of the resin layer complementary to the at least one three-dimensional pattern are removed by chemical attack.

14. The method according to claim 1, wherein, at the end of the step of depositing the at least one metallisation layer, the at least one metallisation layer completely covers the at least one enamel pattern.

15. The method according to claim 1, wherein, at the end of the step of depositing the resin layer, the resin completely covers the metallisation layer.

16. The method according to claim 1, wherein the substrate consists of a material capable of withstanding temperatures that can reach up to 1400° C.

17. The method according to claim 16, wherein the material of the substrate is selected from the group consisting of zirconia, alumina and sapphire.

18. A part manufactured using the manufacturing method according to claim 1, wherein the part is a component decorated with a timepiece external part or a piece of jewellery.

* * * * *